US010553358B2

(12) United States Patent
Bachman et al.

(10) Patent No.: US 10,553,358 B2
(45) Date of Patent: Feb. 4, 2020

(54) ELECTRONIC SUBSTRATES AND INTERPOSERS MADE FROM NANOPOROUS FILMS

(71) Applicant: THE REGENTS OF THE UNIVERSITY OF CALIFORNIA, Oakland, CA (US)

(72) Inventors: Mark Bachman, Irvine, CA (US); Guann-Pyng Li, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/499,756

(22) Filed: Apr. 27, 2017

(65) Prior Publication Data

US 2017/0316881 A1 Nov. 2, 2017

Related U.S. Application Data

(60) Provisional application No. 62/329,446, filed on Apr. 29, 2016.

(51) Int. Cl.
| | |
|---|---|
| *H01L 29/06* | (2006.01) |
| *H01G 4/10* | (2006.01) |
| *H01L 23/64* | (2006.01) |
| *H01L 23/50* | (2006.01) |

(52) U.S. Cl.
CPC .............. *H01G 4/10* (2013.01); *H01L 23/50* (2013.01); *H01L 23/642* (2013.01); *H01L 29/0665* (2013.01); *H01L 29/0673* (2013.01); *H01L 29/068* (2013.01); *H01L 2924/1531* (2013.01); *H01L 2924/19103* (2013.01)

(58) Field of Classification Search
None
See application file for complete search history.

(56) References Cited

U.S. PATENT DOCUMENTS

| | | | |
|---|---|---|---|
| 5,501,893 A | 3/1996 | Laermer et al. | |
| 2014/0104133 A1* | 4/2014 | Finn ................ | G06K 19/07769 343/866 |
| 2014/0199806 A1* | 7/2014 | Lennon .............. | H01L 21/2254 438/98 |
| 2017/0089618 A1* | 3/2017 | Coppola ................ | F25B 19/00 |
| 2017/0294700 A1* | 10/2017 | Ahn ........................ | H01Q 1/38 |

OTHER PUBLICATIONS

Hogan, M., "Silicon interposers: building blocks for 3D-ICs", Solid State Technology, 2011, retrieved from http://electroiq.com/blog/2011/06/silicon-interposers-building-blocks-for-3d-ics/ on Feb. 15, 2018, pp. 1-7.

Lee, W., et al., "Fast fabrication of long-range ordered porous alumina membranes by hard anodization", Nature Materials, 2006, vol. 5, pp. 741-747.

(Continued)

*Primary Examiner* — Bradley Smith
(74) *Attorney, Agent, or Firm* — One LLP (57) ABSTRACT

An electronic substrate or interposer comprising nanoporous films, such as anodic aluminum oxide, containing vertically etched openings ("vias") that are filled with a conductive material, forming a high density collection of vertically oriented vias that conduct electricity from one side of the substrate to the other.

24 Claims, 9 Drawing Sheets

(56) References Cited

OTHER PUBLICATIONS

Lin, R.J., et al., "Fabrication of Nanowire Anisotropic Conductive Film for Ultra-fine Pitch Flip Chip Interconnection", Proceedings of $55^{th}$ Electronic Components and Technology Conference, 2005, pp. 66-125.

Malta, D., et al., "Fabrication of TSV-based silicon interposers", 2010 IEEE International 3D Systems Integration Conference (3DIC), 2010, pp. 1-6.

\* cited by examiner

ELECTRONIC SUBSTRATES AND INTERPOSERS MADE FROM NANOPOROUS FILMS

CROSS-REFERENCE TO RELATED APPLICATIONS

The present application claims the benefit of priority to U.S. Provisional Patent Application Ser. No. 62/329,446 titled "INTERPOSERS MADE FROM NANOPOROUS ANODIC FILMS" filed on Apr. 29, 2016, the contents of which are hereby incorporated by reference in their entirety.

FIELD

The subject matter described herein relates generally to a microelectronic circuit and, more particularly, to an electronic substrate device that is placed between two microelectronic circuits, vertically stacked on each other, to provide electrical contact between points on each circuit.

BACKGROUND

Electronic substrate technology is one of the most important enabling technologies for packaging and 3D integration of microelectronics. Typical electronic substrates are made from organic materials or thin silicon wafers that have vertical holes created within them, which are then filled with a suitable conductor such as metal. These conductive vertical interconnects are known as "vias." These electronic substrates are then used to connect one electronic circuit to another by stacking them. In microelectronic packaging, the electronic substrate is typically used to connect a microelectronic chip to a printed circuit board. In addition, the electronic substrate may be used to connect one microelectronic chip to another by stacking the first chip on top of the second. When used in microelectronic chip stacking, the electronic substrate is referred to as an "interposer". Conventional interposers are made from silicon which can produce somewhat high densities of vias, but are very expensive and difficult to build, requiring special etching and plating steps. Due to the limitations of the deep etch process, conventional silicon fabrication processes typically cannot produce via openings that are closer than approximately 40 microns, resulting in a limited pitch density for interconnects.

Most interposers or electronic substrates for chip-to-chip connections are made from thin silicon wafers that have vertical holes deep etched within them that are then filled with a suitable metal such as copper. These vertical vias are sometimes called "thru-silicon vias" or TSV). These passive silicon interposers are then used to connect one microelectronic chip to another by stacking them between microelectronic chips. Silicon interposers with TSVs offer a way for designers to achieve the benefits of chip-scale connected configurations, allowing compact integration of different microelectronic devices in a single package. The use of a silicon interposer is often referred to as a 2.5D-IC. [Hogan 2011].

Figure 1:
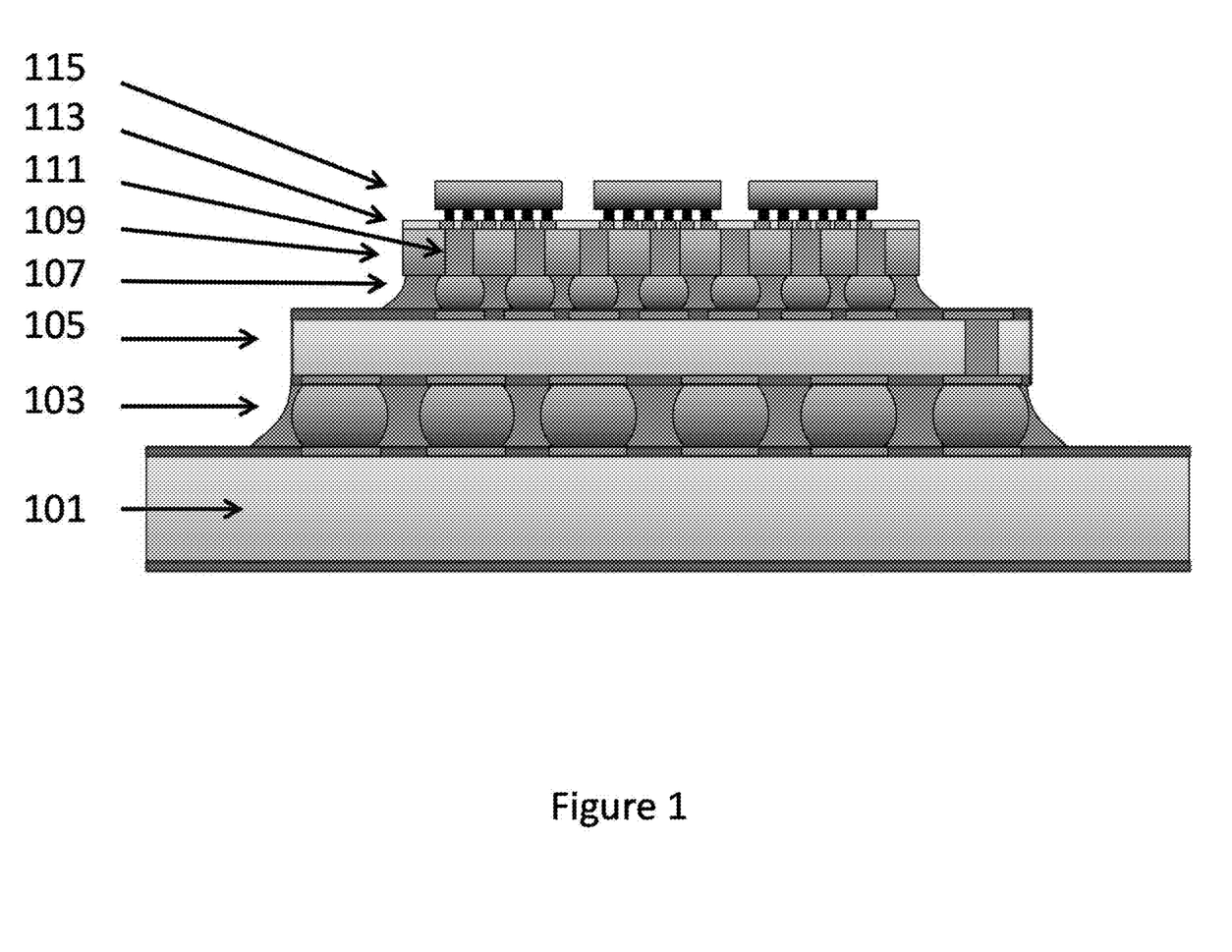
FIG. 1 is an illustration of conventional interposer in a chip stacking application.

A typical interposer application is illustrated in FIG. 1. In this configuration, a printed circuit substrate (101) is prepared with solder connections (103) to a package substrate (105). The package substrate (105) contains micro connections (107), such as a ball grid array, which make electrical contact to a dielectric interposer (109), having a plurality of metal filled vertically conducting vias (111) which make electrical contact between the bottom and top. A redistribution layer (RDL) (113) on the surface of the interposer (109), which makes electrical contact to the contact pads (115) of integrated circuit chips connected to the top of the RDL (113).

Silicon interposers are very expensive and difficult to make, requiring the use of high end etching tools such as deep reactive ion etch [Laermer 1996], and careful electrodeposition of metal into the etched holes. The main elements of a 3D Si interposer typically include front-side multi-level metallization (MLM), TSVs, and one or more layers of backside metallization. The MLM is sometimes referred to as a redistribution later (RDL) [Malta 2010].

Figure 2:
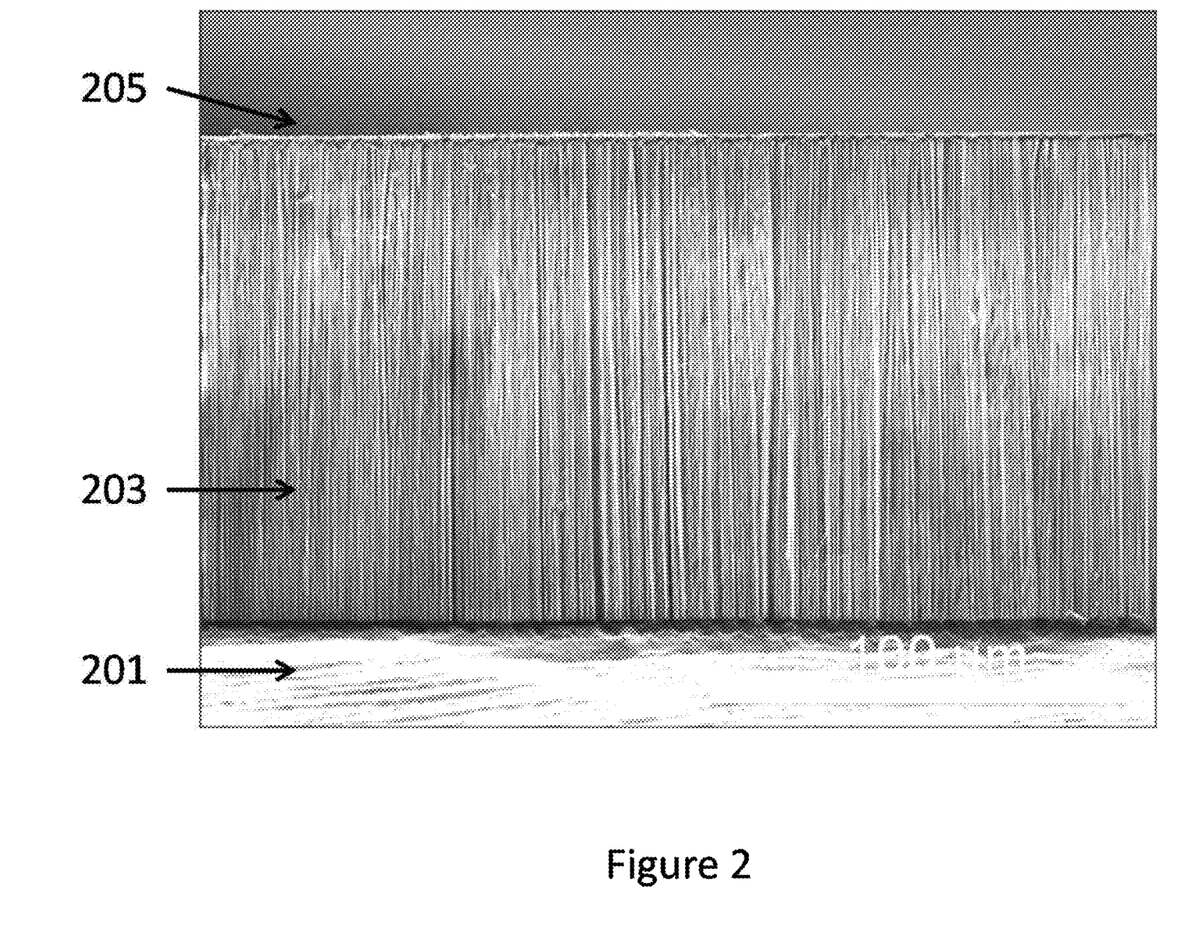
FIG. 2 is a cross-sectional SEM image of anodized aluminum oxide (AAO) showing vertical nanopores.

Certain films, when electrochemically processed, produce highly vertical nanopores through the film thickness. Electrochemically etched silicon and electrochemically oxidized aluminum both exhibit this feature. Anodic aluminum oxide (AAO) is particularly attractive for interposer applications since the starting material (aluminum) is inexpensive, the process is relatively straightforward, and the resulting oxide layer is both strong and highly non-conductive. When anodized properly, AAO exhibits nanoporous structure having highly vertical nanopores extending from the top surface to the bottom layer of the AAO. An example of a deep AAO film is shown in FIG. 2, which shows a scanning electron microscope (SEM) image of a cross section of the AAO film. The film is grown from a base layer of aluminum (201). The film (203) itself consists of anodized aluminum oxide, having vertical pores, which are readily seen in the image, extending from the base to the top surface (205) of the film (203).

Work in the early 2000's demonstrated that vertically grown conductive nanowires in anodized aluminum oxide (AAO) could be used as interposers for chip stacking applications [Lin 2005]. In these devices, a foil or sheet of aluminum is electrochemically anodized (typically twice) to produce a high density of vertically aligned pores (as seen in FIG. 2), often arranged in a honeycomb pattern. Conductive material such as silver or copper is electroplated in these holes to produce a large number of vertically aligned metal nanowires, each wire separated by insulating AAO walls (this process is referred to as nanowire growth in AAO templates). The top and bottom surface of the foil is etched and polished to reveal a thin foil of vertically aligned conductive nanowires. Typical thickness of the foil is 50 microns, which is an appropriate thickness for interposer applications. Since the wires are all vertically aligned and insulated from each other, electrical current can only flow in the vertical direction (z-direction), not in the lateral direction. Researchers have reported electrical resistance from top surface to bottom surface of less than 0.2 ohms, whereas lateral resistance has been reported as greater than 4 Gigaohms [Lin 2005].

Despite initial positive results, interposers made from vertically aligned nanowires have not been commercially successful. The electroplating operation to fill the nanopores is quite time intensive. Furthermore, the existence of so many metal wires surrounding the vias of interest produce a significant amount of capacitive coupling, resulting in loss of signal and cross talk between connections, especially at high frequencies. In addition, the high metal content of the AAO substrate results in excessive stress in the material during thermal cycling.

Many electronic substrates are used for chip-to-printed circuit connections. In these applications, a microelectronic chip is packaged using a hard material (such as epoxy) to protect the fragile chip, and the electronic substrate forms the bottom part of the package, allowing electrical connection between the protected chip and the external printed circuit board. These electronic substrates are called "package substrates" and are typically made from thin organic laminates (FIG. 1, package substrate (105)). Organic laminates typically use drilling or laser etching to produce vertical vias, and are typically unsuitable for producing vias that are very small in diameter or very close together. Such laminates can support holes that are typically no closer than 70 microns apart.

Electronic substrates made from organic laminates are typically made containing via structures that have circular cross section and are metal plated. However, there are many cases where a non-circular, complex cross section openings would be of value. Examples include areas for producing precise response for radio-frequency (RF) and microwave signals, for controlling capacitance or inductance of the package assembly, for providing a heat-sink, or for enabling fluid flow to occur within the package. In addition, organic substrates may not be suitable for carrying high frequency signals. Special conducting structures and low loss dielectrics would be beneficial for carrying high frequency signals through the substrate.

Therefore, it is desirable to provide a low cost, high resolution alternative to conventional organic package substrate technologies that can produce high density, highly vertical conducting vias of arbitrary cross section. This electronic substrate or interposer would be of great value for modern, high density, high power microelectronic packaging and for RF and microwave electronic devices.

SUMMARY

The various embodiments provided herein are generally directed to an electronic substrate or interposer comprising nanoporous films, such as anodic aluminum oxide, containing vertically etched openings ("vias") that may be filled with a conductive material, forming a high density collection of vertically oriented vias that may conduct electricity from one side of the substrate to the other. The various embodiments provided herein disclose the use of nanoporous films, such as anodic aluminum oxide, to easily form vertical openings using low cost wet etchants.

Other systems, methods, features and advantages of the example embodiments will be or will become apparent to one with skill in the art upon examination of the following figures and detailed description.

BRIEF DESCRIPTION OF FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Each of the additional features and teachings disclosed below can be utilized separately or in conjunction with other features and teachings to provide an electronic substrate or an interposer made from a nanoporous film and methods of manufacture. Representative examples of the embodiments described herein, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The various embodiments provided herein are generally directed to an electronic substrate made from a nanoporous film and methods of manufacture. In a preferred embodiment, the material is made from nanoporous anodic aluminum oxide (AAO) which is electrochemically oxidized from an aluminum substrate, typically aluminum sheet or foil. While AAO is the preferred embodiment, other materials, such as silicon, may be used to similar effect.

According to one embodiment, an electronic substrate comprises a nanoporous anodic film having a plurality of vertically aligned nanopores and one or more vertically etched openings.

The one or more etched openings may optionally have a dimension that is one or more times the length of a pitch P of the plurality of nanopores, wherein the pitch P is the distance between adjacent nanopores of the plurality of nanopores. The etched openings are optionally formable with wet etchants. The nanoporous film is optionally a film of anodic aluminum oxide (AAO) material. The nanoporous anodic film is optionally electrochemically oxidized from an aluminum substrate. One or more of the one or more vertically etched openings is optionally filled with metal. The one or more metal filled vertically etched openings are optionally vias.

The nanoporous anodic film may further comprise one or more electrical traces on one of a top and a bottom surface of the nanoporous anodic film. The one or more metal filled vertically etched openings may optionally have passive electronic properties including one of capacitance and inductance. An individual one of the one or more metal filled vertically etched openings is optionally surrounded by and in spaced relation with a metal filled vertically etched opening. The individual one of the one or more metal filled vertically etched openings is optionally a via and the surrounding and in spaced relation metal filled vertically etched opening is optionally an RF shield. The individual one of the one or more metal filled vertically etched openings is optionally a signal via and the surrounding and in spaced relation metal filled vertically etched opening is optionally ground.

One or more of the one or more vertically etched openings is optionally filled with metal to form a heat sink. One or more of the one or more vertically etched openings optionally comprises microfluidic-based active cooling. One or more of the one or more vertically etched openings is optionally filled with adhesive to bond to a microelectronic device.

According to one embodiment, a microelectronic package comprises a microelectronic device having one or more contacts, and an electronic substrate electrically coupled to the one or more contacts of the microelectronic device, the electronic substrate comprising a nanoporous anodic film having a plurality of vertically aligned nanopores and one or more vertically etched openings.

The one or more etched openings optionally has a dimension that is one or more times the length of a pitch P of the plurality of nanopores, wherein the pitch P is the distance between adjacent nanopores of the plurality of nanopores. The etched openings are optionally formable with wet etchants. The nanoporous film is optionally a film of anodic aluminum oxide (AAO) material. The nanoporous anodic film is optionally electrochemically oxidized from an aluminum substrate. One or more of the one or more vertically etched openings is optionally filled with metal. The one or more metal filled vertically etched openings are optionally vias.

The nanoporous anodic film optionally further comprises one or more electrical traces on surface of the nanoporous anodic film, the one or more electrical traces being connected to the one or more vias and the one or more contacts of the microelectronic device.

The one or more metal filled vertically etched openings may optionally have passive electronic properties including one of capacitance and inductance. An individual one of the one or more metal filled vertically etched openings is optionally surrounded by and in spaced relation with a metal filled vertically etched opening. The individual one of the one or more metal filled vertically etched openings is optionally a via and the surrounding and in spaced relation metal filled vertically etched opening is optionally an RF shield. The individual one of the one or more metal filled vertically etched openings is optionally a signal via and the surrounding and in spaced relation metal filled vertically etched opening is optionally ground.

One or more of the one or more vertically etched openings is optionally filled with metal to form a heat sink. One or more of the one or more vertically etched openings optionally comprises microfluidic-based active cooling. One or more of the one or more vertically etched openings is optionally filled with adhesive to bond to a microelectronic device.

According to one embodiment, a microelectronic package further comprises a package substrate electrically coupled to the electronic substrate. According to one embodiment, a microelectronic package further comprises micro connections. The micro connections optionally comprise a ball grid array. According to one embodiment, a microelectronic package further comprises a printed circuit substrate electrically coupled to the package substrate.

According to one embodiment, a method of forming an electronic substrate comprises generating an anodic nanoporous film have a plurality of vertically aligned nanopores from a substrate, coating the film with a protective layer, patterning the protective layer to form protected and one or more unprotected regions of the film, and etching the one or more unprotective regions of the film forming one or more vertically etched holes in the film.

The substrate is optionally aluminum.

According to one embodiment, the method of forming an electronic substrate further comprises electroplating a metal to fill the one or more vertically etched holes with the metal. Electroplating optionally comprises one of DC plating and pulse plating with the aluminum substrate acting as a cathode. According to one embodiment, the method of forming an electronic substrate further comprises forming a redistribution layer on one or more of the top and bottom surfaces of the film. The aluminum substrate is optionally one of a foil and a sheet. Patterning the protective layer optionally includes lithographically patterning the protective layer. Etching optionally comprises one of a chemical etch, a vapor etch, a plasma etch and a layer etch. The chemical etch optionally comprises a chemical bath of sodium hydroxide. Generating the film optionally comprises one of electrochemically oxidizing and anodizing the aluminum substrate. Anodizing optionally includes exposing the aluminum substrate to acid. The acid is optionally oxalic acid.

Figure 3:
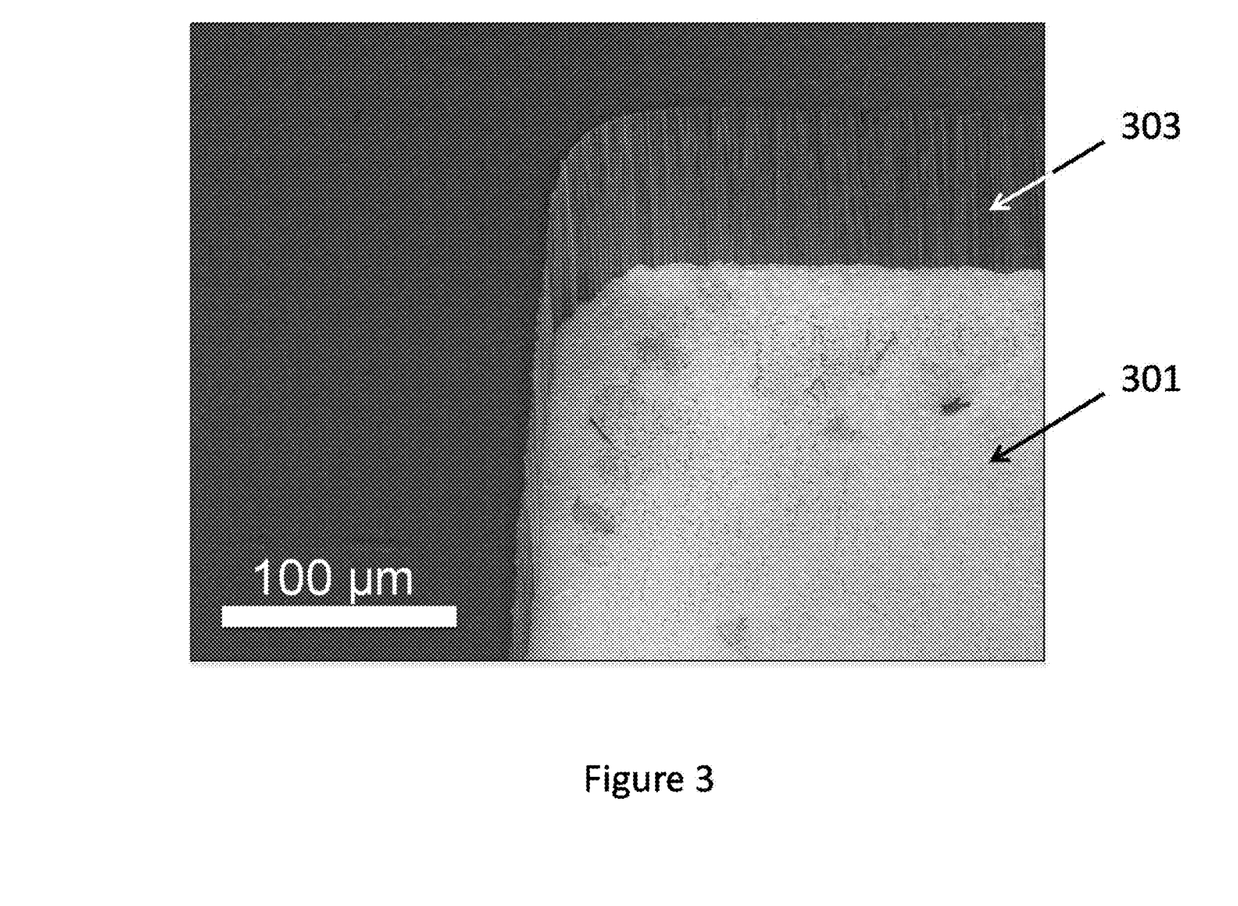
FIG. 3 is a SEM image of an etched AAO on aluminum base.
Figure 4:
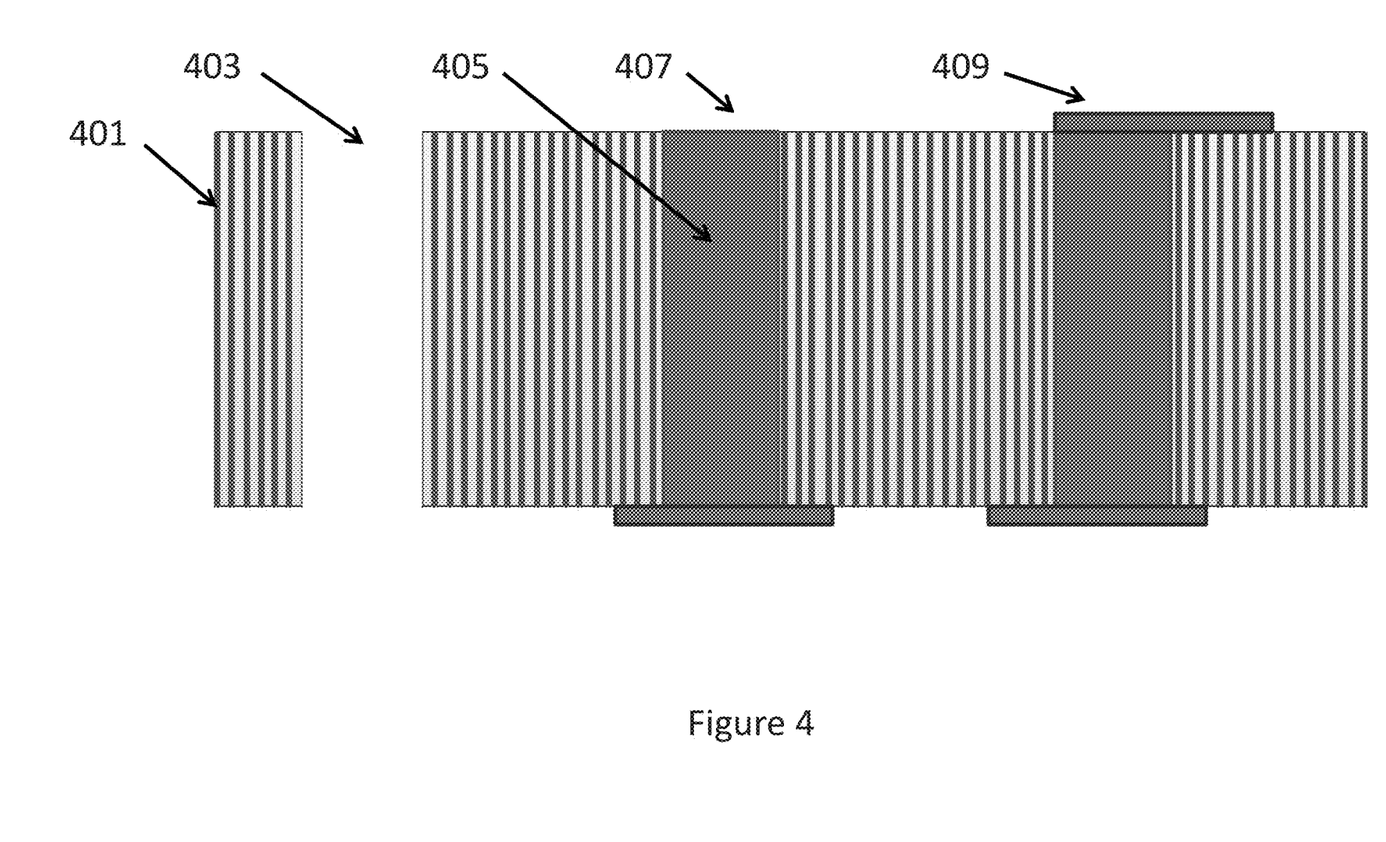
FIG. 4 is an illustration of an embodiment of an AAO electronic substrate.

FIG. 4 shows an illustration of an embodiment of an electronic substrate or interposer (401). The electronic substrate (401) preferably comprises nanoporous AAO, a dielectric having a high density of vertically aligned nanopores. An alternative way to use the AAO material exploits a little known property of AAO films, namely that they can be chemically etched to produce holes or openings with highly vertical sidewalls. The highly anisotropic structure of the film results in a highly anisotropic chemical etch. FIG. 3 shows an SEM image of AAO film that was etched using sodium hydroxide. The surface of the AAO film was protected with a second film (silicon dioxide) that is non-reactive to sodium hydroxide, with openings in the protective film at specific locations. The resulting film had holes etched at the corresponding specific regions. The SEM image reveals an opening with a highly vertical etch through the AAO. The base of aluminum (301) is seen, with the etched AAO (303) having nearly vertical sidewalls. This etch with highly vertical etch holes allows for the creation of electronic substrates and interposers, since these openings can be filled with metal and used as vias. The embodiments provided herein use of nanoporous films, especially AAO, for making electronic substrates and interposers by etching via openings with vertical sidewalls, and optionally filling the openings with materials such as metal.

Returning to FIG. 4, the electronic substrate (401) has one or more vertically etched openings (403), and with one or more of the openings filled with metal (405). The metal filled, vertically etched openings are herein referred to as "vias". The surface (407) of the metal vias may be polished, or may have additional electrical traces (409) fabricated on top for redistributing or routing the electrical signal. The electronic substrate film may be prepared to be typically between about 5 micrometers thick to several hundred micrometers thick. The electronic substrate may contain other etched regions, cavities, and holes of a variety of shapes, which may be unfilled or filled with other materials for the purpose of adding additional functionality or benefit to the electronic substrate. The electronic substrate may also contain other materials on the top or bottom of the film, such as metals, oxides, or polymers that make the electronic substrate more useful, more reliable, or simplify manufacturing. The electronic substrate material may be prepared as a laminate consisting of AAO, with metal or dielectric layers bonded or deposited on one or both sides of the AAO film. The top and bottom layers may be lithographically patterned and etched as appropriate for the purpose of making a mask against the deep etch, or for providing a patterned conductive surface for performing electroplating of the openings, or for providing electrical contact pads.

Figure 5A:
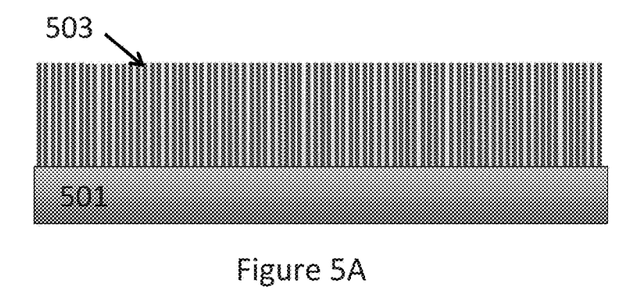
FIGS. 5A, 5B, 5C, 5D, 5E and 5F illustrate the steps in a process for fabricating an AAO electronic substrate.

An exemplary process of fabricating the electronic substrate in AAO material is illustrated in FIGS. 5A-5F. As shown in FIG. 5A, an aluminum substrate (foil or sheet) (501) is prepared and an AAO film (503) is electrochemically produced on its surface. Electrochemically producing an aluminum oxide film with vertical nanopores is well established in the art (see for example [Lee 2006]). An aluminum substrate is electrochemically oxidized (anodized) to produce a high density of vertical nanopores in the oxide surface (the top surface). Anodization of AAO is typically performed using oxalic acid or a similar acid. Common in the art is to anodize a thin first layer, then etch the first oxide layer away and repeat the anodization process again (double anodization), resulting in a higher density of nanopores that are regularly aligned, typically in a honeycomb pattern. After anodization, the porous surface may be electrochemically or mechanically polished. The result is a layer of anodized film on the surface of an aluminum substrate.

Figure 5B:
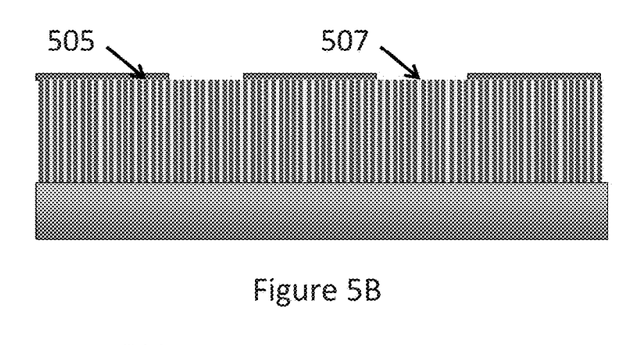

As shown in FIG. 5B, the porous top surface is coated with a material (505), such as polymer, oxide, or metal, covering the pores of the film (503), and acting as a protective layer against the future etch. The protective layer (505) is patterned using lithography, laser, or other means to produce regions over the surface that are protected and regions that are unprotected (507). Following this, the material is placed in an etching environment intended to etch the AAO film. The etching environment may be a wet chemical etch, vapor etch, plasma etch, laser etch, or any combination. In the case of laser etch, a protective film may not be necessary and etching may be performed without a coating on the top surface. In the preferred embodiment, the etch is a chemical bath of sodium hydroxide. Other chemical baths are known to etch AAO and may also be used.

Figure 5C:
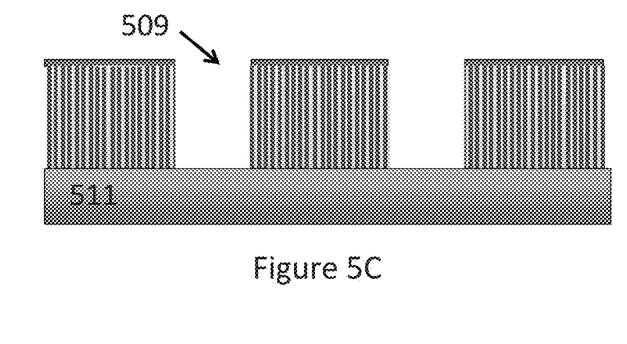

During etching, the unprotected regions of the AAO are removed as shown in FIG. 5C, revealing open cavities (509) that expose the underlying aluminum substrate (511). The aluminum substrate (511) is not strongly attacked by the etchant, so remains intact and acts as an etch stop for the AAO etch. One or more of these open cavities or via holes (509) may be filled with metal to produce a conductive via from the bottom side of the AAO to the top surface. The preferred method of filling the via holes is electroplating. Other methods of filling the openings may be employed, such as mechanically dispensing slurry or liquid emulsions in the openings.

Figure 5D:
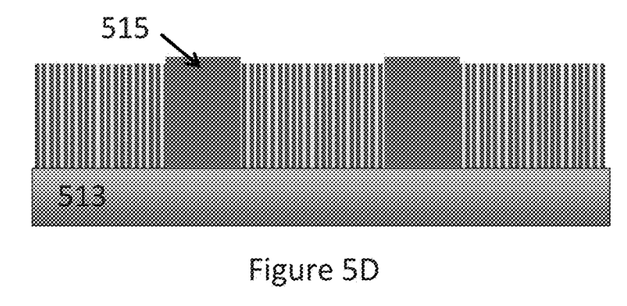

Electroplating of metal to fill the open via holes is performed by standard methods, such as DC plating, pulse plating or similar, with the aluminum substrate (513) acting as the cathode. Plating in this manner causes metal (515), as shown in FIG. 5D, to fill in the via holes (509), growing from the aluminum substrate (513) through the etched AAO openings. After filling the via holes (509) by plating, the top surface may be polished to produce smooth electrical contacts. In the preferred embodiment, the vias are filled with copper, which may be further coated with other metals, such as nickel and gold, if desired.

Figure 5E:
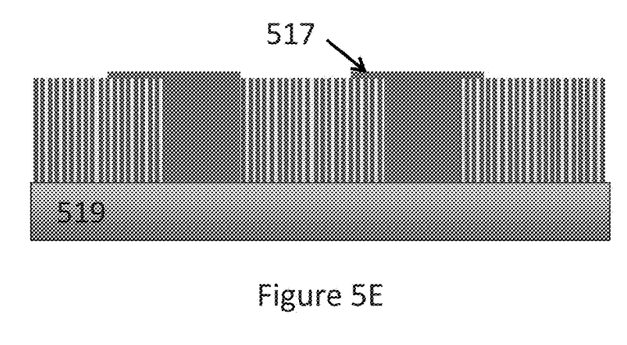

Further processing on the surface may be performed as shown in FIG. 5E, such as the formation of redistribution layers (517) or other structures intended to enhance the performance or function of the electronic substrate. During these steps, the aluminum substrate (foil or sheet) may be retained for handling purposes (519) if desired.

Figure 5F:
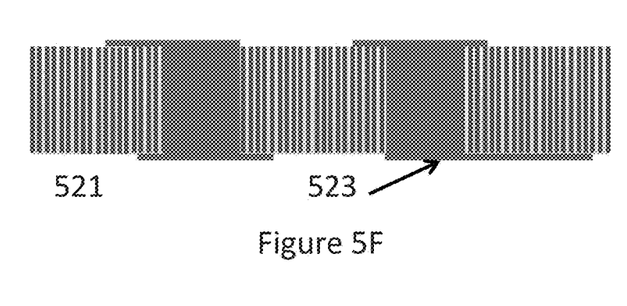

After filling the vias with metal, and completing surface processes, the bottom aluminum substrate may be removed as shown in FIG. 5F, if desired, by etching in a suitable etchant, such as concentrated HCl (521). After removal of the aluminum, the bottom layer of AAO and copper may be polished to produce smooth electrical contacts, and further processing may be performed, such as to produce additional electrical traces (523). If desired, a carrier plate may be temporarily bonded to the top surface of the processed AAO to assist in the processing of the bottom layer after the aluminum substrate is removed.

It will be appreciated that variations of utilizing the vertical etch properties of AAO for microfabrication to produce the electronic substrate are within the scope of the present disclosure.

Figure 6:
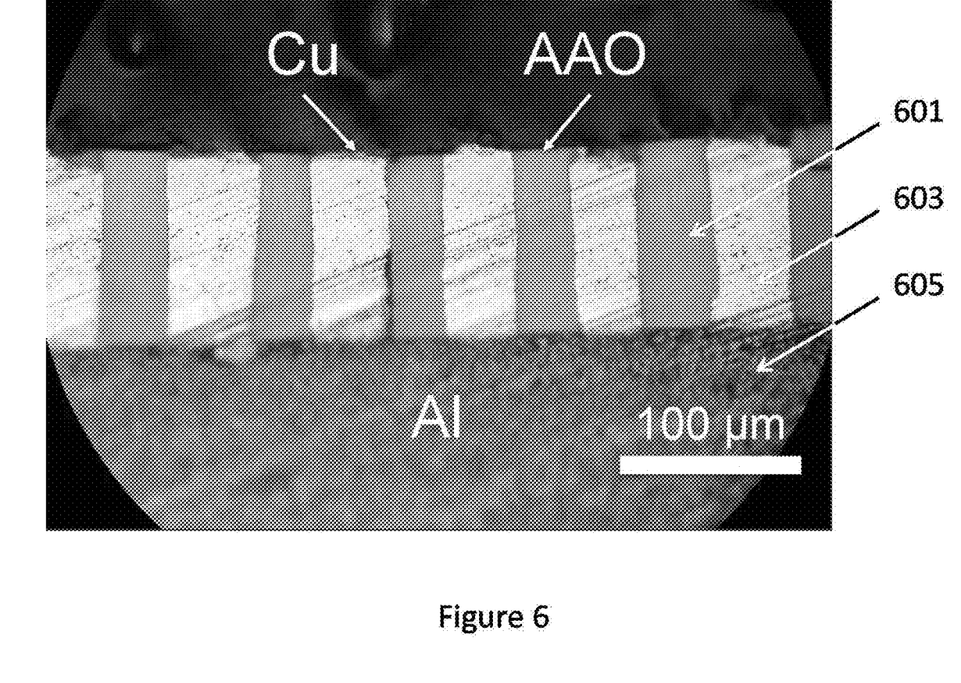
FIG. 6 is a cross-section image of an AAO electronic substrate fabricated according to the steps of the embodiments described herein.

FIG. 6 shows a cross-section image of an AAO interposer or electronic substrate device made using the present process. This device was fabricated using AAO film (601) that was 100 micrometers thick. The vias were etched at 40 micrometers in diameter and filled with copper (603). This image shows the device still attached to the aluminum substrate (605) which acts as a carrier.

Figure 7A:
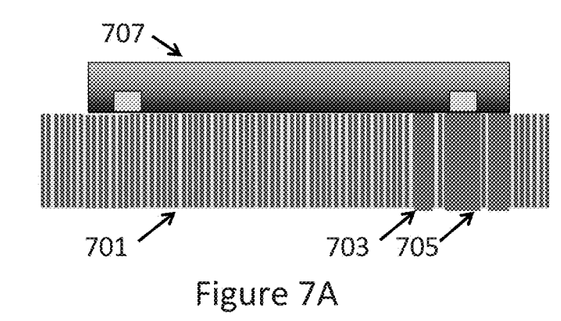
FIGS. 7A, 7B, 7C and 7D illustrate various embodiments of an AAO electronic substrate.
Figure 7B:
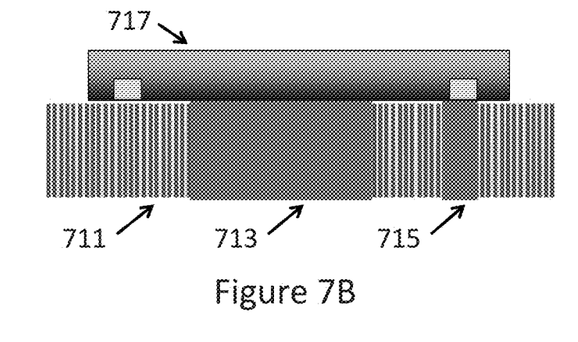
Figure 7C:
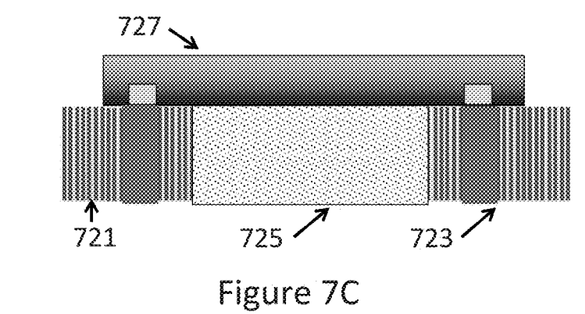
Figure 7D:
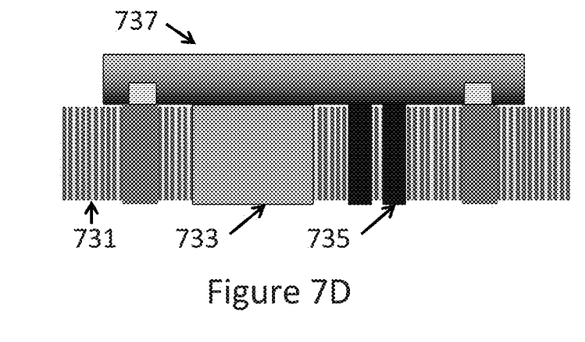

In addition to producing via holes and filling with metal, the current embodiments include the formation of additional structural elements within the electronic substrate material for the purpose of enhancing the function or performance of the device. FIGS. 7A-7D illustrate some examples of an AAO electronic substrate with additional functions and features. In FIG. 7A, the electronic substrate (701) may include a metal filled region (703) intended to act as an RF shield by surrounding a via (705) that makes electrical contact with a microelectronic device (707). The electronic substrate (711) may contain metal filled regions (713), as shown in FIG. 7B, that enhance the thermal properties of the electronic substrate, while still providing vias (715) for electrical connections to an external microelectronic device (717). As shown in FIG. 7C, the electronic substrate (721) may contain electrical vias (723) that connect to a bonded microelectronic device (727), and may contain an open reservoir (725) containing adhesive which can be used to bond the microelectronic device (727) to the electronic substrate (721). As shown in FIG. 7D, the electronic substrate (731) may also contain openings that provide for microfluidic-based active cooling (733), as well as embedded metalized regions that provide passive electronic properties such as capacitors and inductors (735), enhancing the function attached microelectronic devices (737).

Figure 8:
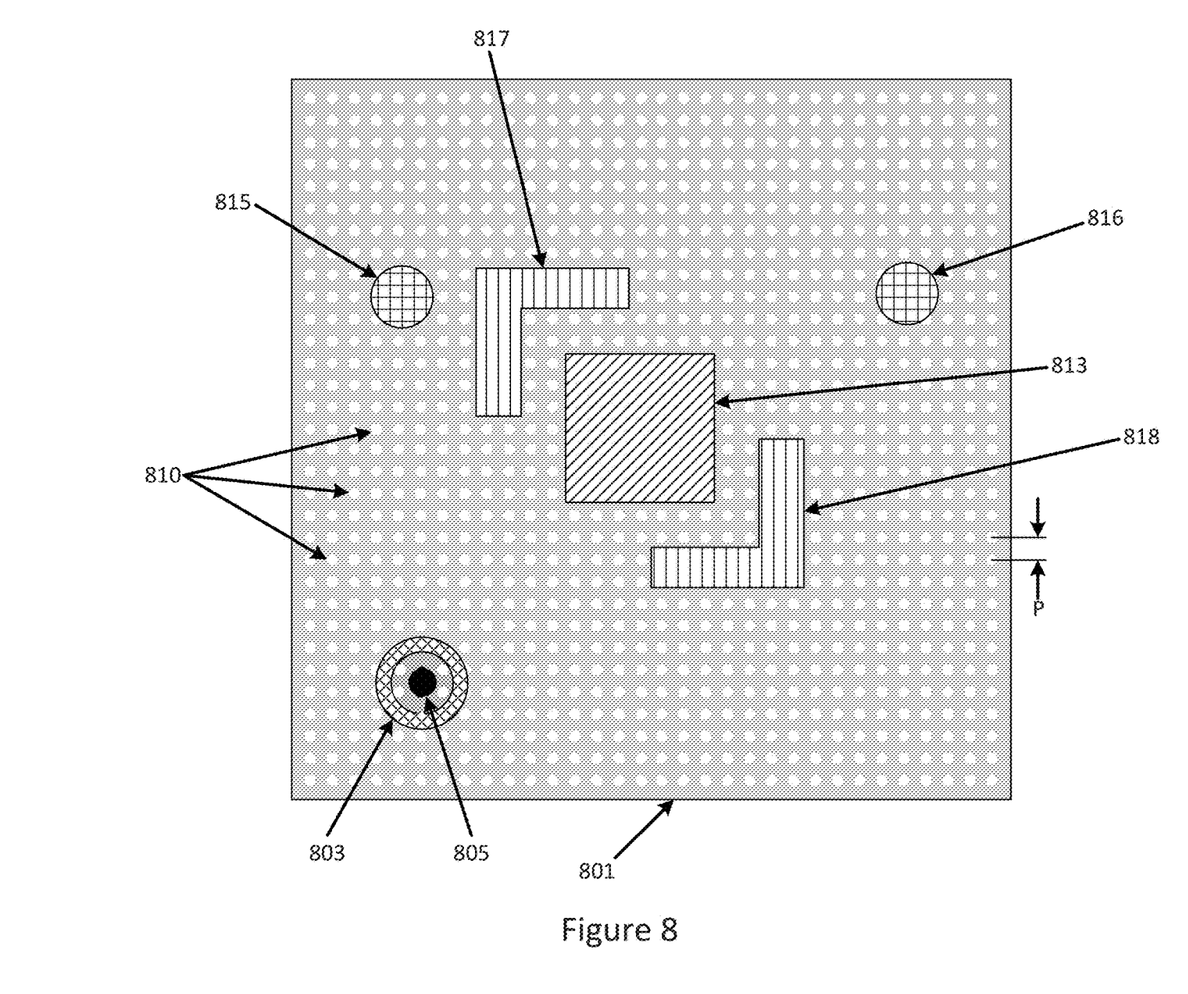
FIG. 8 is a top view illustrating another embodiment of an AAO electronic substrate.

FIG. 8 provides a top view an AAO electronic substrate that illustrates some examples of additional functions and features. As depicted, an AAO electronic substrate (801) having a plurality of highly vertical nanopores (810) may include a metal filled region (803) acting as ground and surrounding a signal via (805) that makes electrical contact with a microelectronic device (not shown). The electronic substrate (801) may include a region (813), that is filled with metal or that provides for microfluidic-based active cooling to enhance the thermal properties of the electronic substrate (801), while still providing vias (815 and 816) for electrical connections to an external microelectronic device (not shown). As further depicted, the electronic substrate (801) may contain one or more open reservoirs (817 and 818) containing adhesive which can be used to bond a microelectronic device to the interposer (801). As illustrated in FIG. 8, the etched holes in the electronic substrate (801) can be of a variety of shapes and are preferably have a diameter, width, length or other dimension that is one or more times greater in size than the pitch (P) of the nanopores (810).

Figure 9:
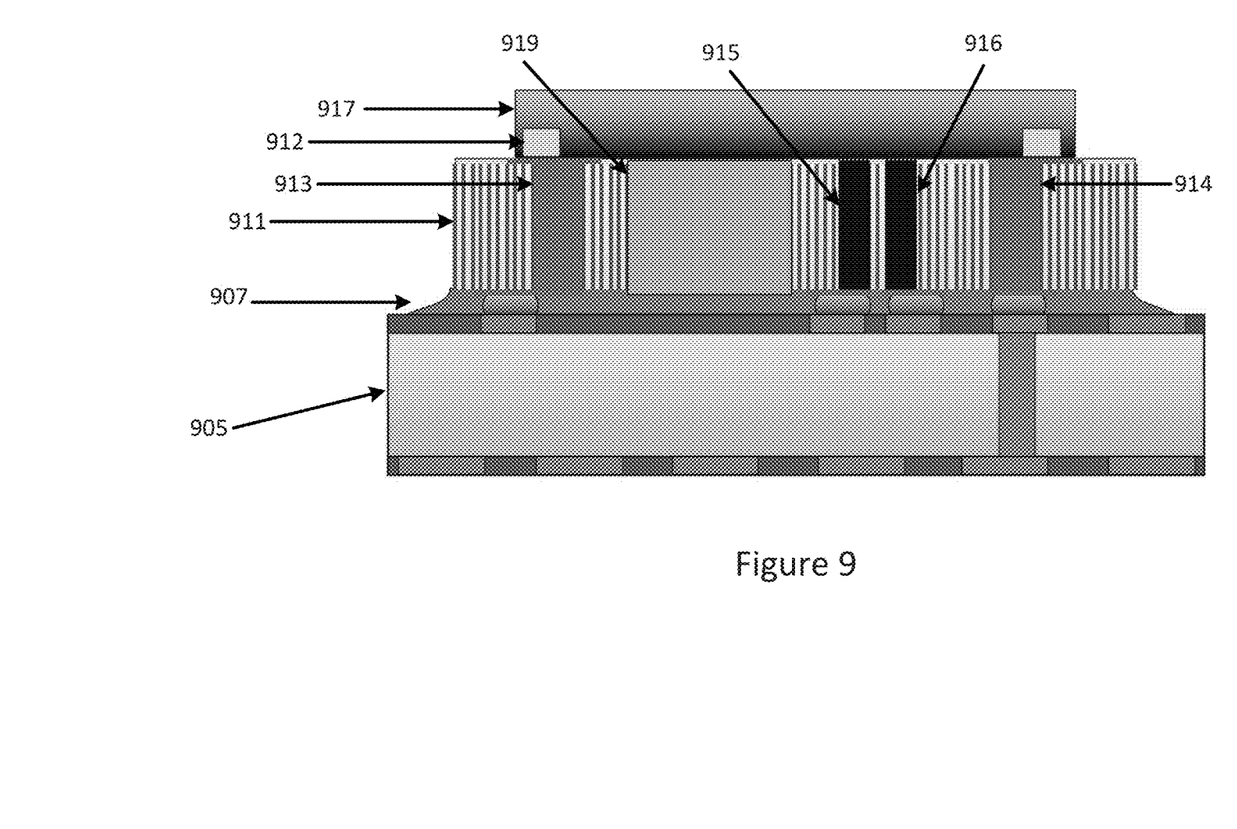
FIG. 9 is an illustration of a representative example of an AAO electronic substrate in a chip stacking application.

An exemplary electronic substrate application is illustrated in FIG. 9. As depicted, a package substrate (905), which is mountable on a substrate such as, e.g., a printed circuit substrate (not shown), contains micro connections (907), such as a ball grid array, which make electrical contact to a AAO electronic substrate (911), having a plurality of metal filled vertically conducting vias (913 and 914) which make electrical contact between electrical traces at the bottom and top, which contact the micro connection (907) and contact pads (912) of a microelectronic device (917). The electronic substrate may also contain an opening (919) that may provide for microfluidic-based active cooling or be filled with metal to enhance the thermal properties of the electronic substrate (911), as well other openings (915 and 916) that are embedded metalized regions that provide passive electronic properties such as capacitors and inductors, enhancing the function of the attached microelectronic devices (917).

These examples are illustrative of the various embodiments and additional features that are afforded by the AAO electronic substrate or interposer, and are not intended to represent an exhaustive list of features. The example embodiments provided herein, however, are merely intended as illustrative examples and not to be limiting in any way.

All features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances entities are described herein as being coupled to other entities. It should be understood that the terms "coupled" and "connected" (or any of their forms are used interchangeably herein and, in both cases, are generic to the direct coupling of two entities (without any non-negligible (e.g., parasitic intervening entities and the indirect coupling of two entities (with one or more non-negligible intervening entities. Where entities are shown as being directly coupled together, or described as coupled together without description of any intervening entity, it should be understood that those entities can be indirectly coupled together as well unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

REFERENCES

[Hogan 2011] Matthew Hogan, "Silicon interposers: building blocks for 3D-ICs", Solid State Technology, 2011. (http://electroiq.com/blog/2011/06/silicon-interposers-building-blocks-for-3d-ics/)

[Malta 2010] Malta, D.; Vick, E.; Goodwin, S.; Gregory, C.; Lueck, M.; Huffman, A.; Temple, D. "Fabrication of TSV-based silicon interposers", 2010 IEEE International 3D Systems Integration Conference (3DIC) (2010).

[Laermer 1996] F. Laermer, A. Schilp, "Method of Anisotropically Etching Silicon", U.S. Pat. No. 5,501,893, March, 1996.

[Lin 2005] Ren-Jen Lin, Yung-Yu Hsu, Yu-Chih Chen, Syh-Yuh Cheng* and Ruoh-Huey Uang, "Fabrication of Nanowire Anisotropic Conductive Film for Ultra-fine Pitch Flip Chip Interconnection", 2005 Electronic Components and Technology Conference (2005).

[Lee 2006] W. Lee, R. Ji, U. Gosele, and K. Nielsch, "Fast fabrication of long-range ordered porous alumina membranes by hard anodization," Nature Mater., vol. 5, August 2006, pp. 741-747, doi:10.1038/nmat1717.

What is claimed:
1. An electronic substrate comprising
   a nanoporous film having both a plurality of vertically aligned nanopores and one or more vertically etched openings, wherein an opening of the one or more vertically etched openings has one of a length, a width or a diameter that is one or more times a length of a pitch P of the plurality of vertically aligned nanopores, wherein the pitch P is a distance between adjacent vertically aligned nanopores of the plurality of vertically aligned nanopores.
2. The electronic substrate of claim 1 where the film is produced by anodization.
3. The electronic substrate of claim 1 wherein the etched openings are formable with wet etchants.

4. The electronic substrate of claim 1 wherein the nanoporous film is a film of anodic aluminum oxide (AAO) material.

5. The electronic substrate of claim 1 wherein nanoporous anodic film is electrochemically oxidized from an aluminum substrate.

6. The electronic substrate of claim 1 wherein one or more of the one or more vertically etched openings is filled with metal.

7. The electronic substrate of claim 6 wherein the one or more metal filled vertically etched openings are vias.

8. The electronic substrate of claim 6 wherein the nanoporous anodic film further comprising one or more electrical traces on one of a top and a bottom surface of the nanoporous anodic film.

9. The electronic substrate of claim 6 wherein the one or more metal filled vertically etched openings have passive electronic properties including one of capacitance and inductance.

10. The electronic substrate of claim 6 wherein an individual one of the one or more metal filled vertically etched openings is surrounded by and in spaced relation with a metal filled vertically etched opening.

11. The electronic substrate of claim 10 wherein the individual one of the one or more metal filled vertically etched openings is a via and the surrounding and in spaced relation metal filled vertically etched opening is an RF shield.

12. The electronic substrate of claim 10 wherein the individual one of the one or more metal filled vertically etched openings is a signal via and the surrounding and in spaced relation metal filled vertically etched opening is ground.

13. The electronic substrate of claim 1 wherein one or more of the one or more vertically etched openings is filled with metal to form a heat sink.

14. The electronic substrate of claim 1 wherein one or more of the one or more vertically etched openings comprises microfluidic-based active cooling.

15. The electronic substrate of claim 1 wherein one or more of the one or more vertically etched openings is filled with adhesive to bond to a microelectronic device.

16. The electronic substrate of claim 1, wherein the one or more vertically etched openings comprises highly vertical sidewalls.

17. A microelectronic package comprising
a microelectronic device having one or more contacts, and
an electronic substrate electrically coupled to the one or more contacts of the microelectronic device, the electronic substrate comprising a nanoporous anodic film having both a plurality of vertically aligned nanopores and one or more vertically etched openings, wherein an opening of the one or more vertically etched openings has one of a length, a width or a diameter that is one or more times a length of a pitch P of the plurality of vertically aligned nanopores, wherein the pitch P is a distance between adjacent vertically aligned nanopores of the plurality of vertically aligned nanopores.

18. An electronic substrate comprising
a nanoporous anodic film having both a plurality of vertically aligned nanopores and one or more vertically etched openings, wherein an opening of the one or more vertically etched openings has one of a length, a width or a diameter that is equal to a length of a pitch P of the plurality of vertically aligned nanopores, wherein the pitch P is a distance between adjacent vertically aligned nanopores of the plurality of vertically aligned nanopores.

19. The electronic substrate of claim 18, wherein the one or more vertically etched openings comprises highly vertical sidewalls.

20. An electronic interposer comprising
a nanoporous anodic film having both a plurality of vertically aligned nanopores and one or more vertically etched metal filled openings, wherein an opening of the one or more vertically etched metal filled openings has a dimension that is one or more times a length of a pitch P of the plurality of vertically aligned nanopores, and wherein the opening of the one or more vertically etched metal filled openings has a diameter that is approximately 40 microns.

21. The electronic interposer of claim 20, wherein the pitch P is a distance between adjacent vertically aligned nanopores of the plurality of vertically aligned nanopores.

22. The electronic interposer of claim 20, wherein the nanoporous anodic film has a thickness of 50 microns.

23. The electronic interposer of claim 20, wherein the nanoporous anodic film has a thickness of 100 microns.

24. The electronic interposer of claim 20, wherein the one or more vertically etched metal filled openings comprises highly vertical sidewalls.

* * * * *